United States Patent
Karpov et al.

(10) Patent No.: US 7,135,696 B2
(45) Date of Patent: Nov. 14, 2006

(54) PHASE CHANGE MEMORY WITH DAMASCENE MEMORY ELEMENT

(75) Inventors: Ilya V. Karpov, Santa Clara, CA (US); Charles C. Kuo, Union City, CA (US); Yudong Kim, Santa Clara, CA (US); Fabio Pellizzer, Follina (IT)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 10/949,090

(22) Filed: Sep. 24, 2004

(65) Prior Publication Data

US 2006/0073631 A1    Apr. 6, 2006

(51) Int. Cl.
*H01L 21/00* (2006.01)

(52) U.S. Cl. ............... 257/2; 257/3; 257/4; 257/5; 257/296; 257/298; 257/529; 257/536; 257/537; 257/614

(58) Field of Classification Search ............ 257/2–5, 257/296, 298, 529, 536–537, 614
See application file for complete search history.

(56) References Cited

U.S. PATENT DOCUMENTS

| | | | |
|---|---|---|---|
| 6,339,544 B1 * | 1/2002 | Chiang et al. ............ 365/163 |
| 6,566,700 B1 * | 5/2003 | Xu ........................... 257/296 |
| 6,707,087 B1 * | 3/2004 | Fricke et al. ............. 257/296 |
| 6,764,894 B1 * | 7/2004 | Lowrey .................... 438/238 |
| 6,791,102 B1 * | 9/2004 | Johnson et al. ............. 257/3 |
| 6,869,883 B1 * | 3/2005 | Chiang et al. ............ 438/700 |
| 6,972,430 B1 * | 12/2005 | Casagrande et al. ......... 257/4 |
| 2005/0029627 A1 * | 2/2005 | Dennison .................. 257/618 |
| 2005/0032307 A1 * | 2/2005 | Karpov ..................... 438/257 |
| 2005/0064606 A1 * | 3/2005 | Pellizzer et al. ............ 438/3 |

OTHER PUBLICATIONS

Van Landingham, "Circuit Applications of Ovonic Switching Devices", IEEE Transactions on Electron Devices, vol. ED-20, No. 2, Feb. 1973.

* cited by examiner

*Primary Examiner*—Lynne A. Gurley
(74) *Attorney, Agent, or Firm*—Trop, Pruner & Hu, P.C.

(57) ABSTRACT

A phase change material may be formed within a trench in a first layer to form a damascene memory element and in an overlying layer to form a threshold device. Below the first layer may be a wall heater. The wall heater that heats the overlying phase change material may be formed in a U-shape in some embodiments of the present invention. The phase change material for the memory element may be elongated in one direction to provide greater alignment tolerances with said heater and said threshold device.

27 Claims, 6 Drawing Sheets

PHASE CHANGE MEMORY WITH DAMASCENE MEMORY ELEMENT

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
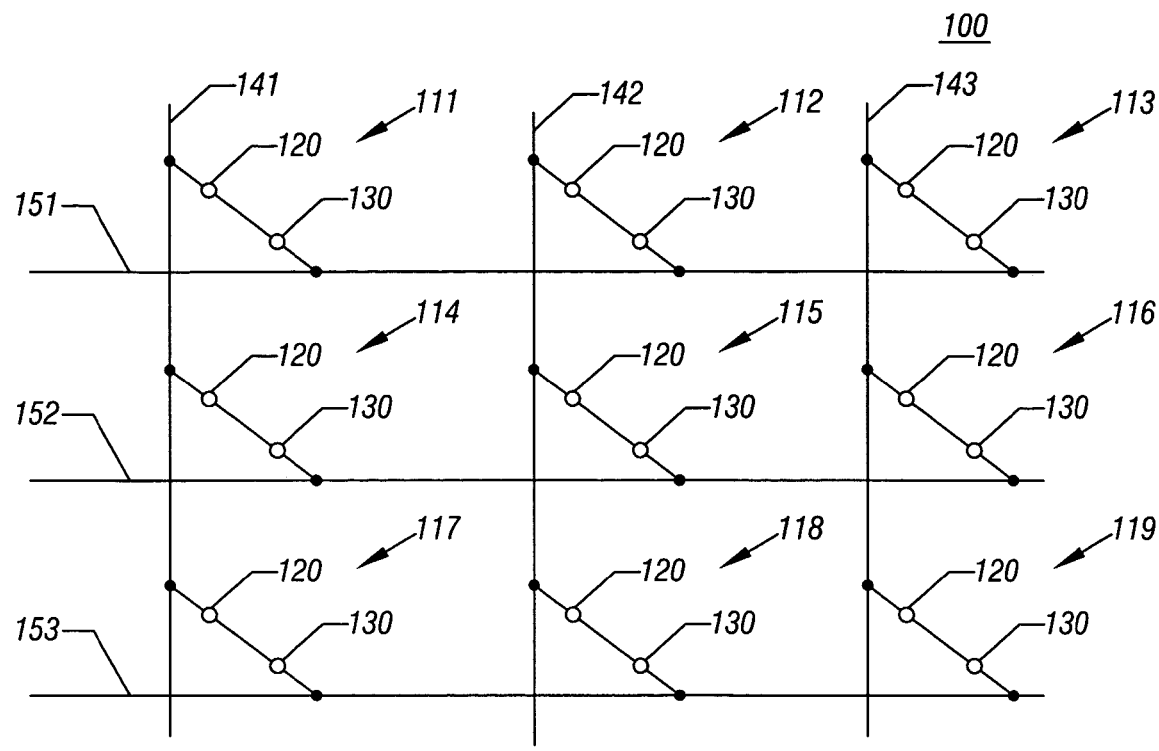
FIG. 1 is a schematic diagram illustrating a memory in accordance with one embodiment of the present invention.

Turning to FIG. 1, an embodiment of a memory 100 is illustrated. Memory 100 may include a 3×3 array of memory cells 111–119, wherein memory cells 111–119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141–143 and row lines 151–153 to select a particular memory cell of the array during a write or read operation. Column lines 141–143 and row lines 151–153 may also be referred to as address lines since these lines may be used to address memory cells 111–119 during programming or reading. Column lines 141–143 may also be referred to as bit lines and row lines 151–153 may also be referred to as word lines.

Memory elements 130 may be connected to row lines 151–153 and may be coupled to column lines 141–143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. The select device 120 may be an ovonic threshold switch that can be made of a chalcogenide alloy that does not exhibit an amorphous to crystalline phase change and which undergoes rapid, electric field initiated change in electrical conductivity that persists only so long as a holding voltage is present. Select device 120 may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state. In the on state, the voltage across the select device is equal to its holding voltage $V_H$ plus I×Ron, where Ron is the dynamic resistance from $V_H$. For example, select device 120 may have threshold voltage and, if a voltage potential less than the threshold voltage of a select device 120 is applied across select device 120, then at least one select device 120 may remain "off" or in a relatively high resistive state so that little or no electrical current passes through the memory cell and most of the voltage drop from selected row to selected column is across the select device. Alternatively, if a voltage potential greater than the threshold voltage of select device 120 is applied across select device 120, then the select device 120 may "turn on," i.e., operate in a relatively low resistive state so that electrical current passes through the memory cell. In other words, select device 120 may be in a substantially electrically nonconductive state if less than a predetermined voltage potential, e.g., the threshold voltage, is applied across select device 120. Select device 120 may be in a substantially conductive state if greater than the predetermined voltage potential is applied across select device 120. Select device 120 may also be referred to as an access device, an isolation device, or a switch.

In one embodiment, each select device 120 may comprise a switching material such as, for example, a chalcogenide alloy, and may be referred to as an ovonic threshold switch, or simply an ovonic switch. The switching material of select device 120 may be a material in a substantially amorphous state positioned between two electrodes that may be repeatedly and reversibly switched between a higher resistance "off" state (e.g., greater than about ten megaohms) and a relatively lower resistance "on" state (e.g., about one thousand Ohms in series with $V_H$) by application of a predetermined electrical current or voltage potential. In this embodiment, each select device 120 may be a two terminal device that may have a current-voltage (I-V) characteristic similar to a phase change memory element that is in the amorphous state. However, unlike a phase change memory element, the switching material of select device 120 may not change phase. That is, the switching material of select device 120 may not be a programmable material, and, as a result, select device 120 may not be a memory device capable of storing information. For example, the switching material of select device 120 may remain permanently amorphous and the I-V characteristic may remain the same throughout the operating life. A representative example of I-V characteristics of select device 120 is shown in FIG. 2.

Figure 2:
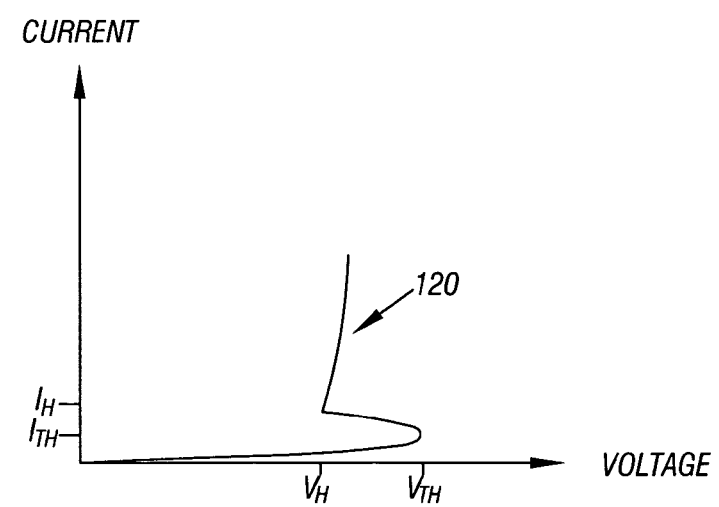
FIG. 2 is a diagram illustrating a current-voltage characteristic of an access device.

Turning to FIG. 2, in the low voltage or low electric field mode, i.e., where the voltage applied across select device 120 is less than a threshold voltage (labeled $V_{TH}$), select device 120 may be "off" or nonconducting, and exhibit a relatively high resistance, e.g., greater than about 10 megaOhms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential, labeled $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current, labeled $I_H$. Below this value, select device 120 may turn off and return to a relatively high resistance, nonconductive off state until the $V_{TH}$ and $I_{TH}$ are exceeded again.

Figure 3:
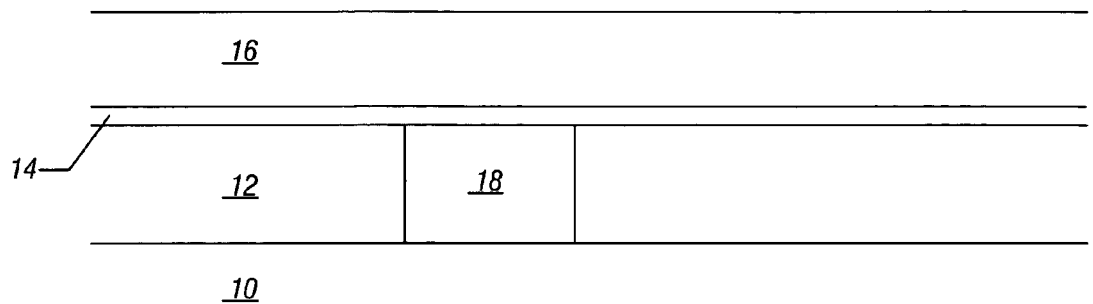
FIG. 3 is an enlarged, cross-sectional view at an early stage of manufacture in accordance with one embodiment of the present invention.

Referring to FIG. 3, a substrate 10 may include a semiconductor substrate and one or more layers thereover. Over the substrate 10 is a silicon dioxide layer 12 having a conductor 18 formed therein. In one embodiment, the conductor 18 is a row line 151–153 (FIG. 1). The oxide layer 12 may be under a nitride layer 14 and under another oxide layer 16 in accordance with conventional damascene processing.

Figure 4:
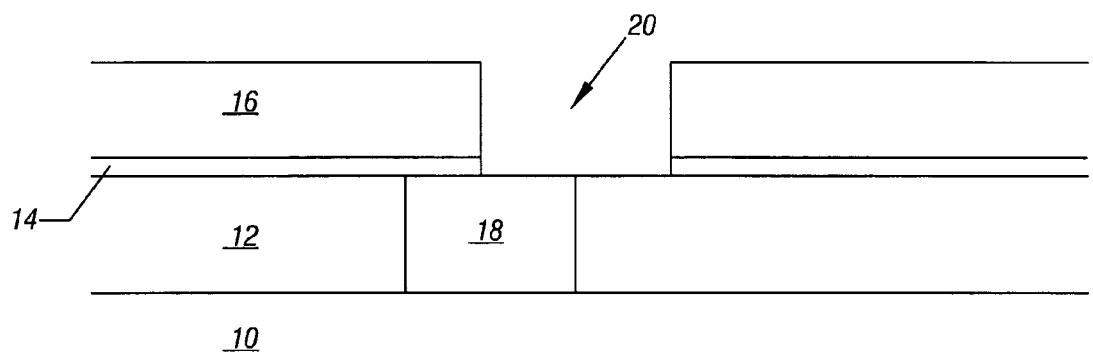
FIG. 4 is an enlarged, cross-sectional view of the embodiment shown in FIG. 3 at a subsequent stage of manufacture in accordance with one embodiment of the present invention.

A wall trench 20 may be formed through the layers 14 and 16 as shown in FIG. 4. In the trench 20 may first be formed a heater layer 22, for example, if titanium silicon nitride. In one embodiment, the layer 22 may be formed in a chemical vapor deposition process using tetrakis-(dimethylamino) titanium (TDMAT) and silane, for example. According to another embodiment of the present invention, TDMAT may be utilized as a precursor to form titanium silicon nitride films for phase change memory heaters. A combination of TDMAT and tris-(dimethylamino) silane (TrDMASi) may be utilized to form titanium silicon nitride films with relatively higher resistivity and relatively higher percentages of silicon. For example, titanium silicon nitride films with greater than 10 atomic percent silicon may be formed. The higher the silicon content, the higher the resistivity of the film. The higher the film's resistivity, the better it functions to heat a phase change material in response to current flow.

The two amine or organometallic precursors can be premixed or mixed in situ to form the titanium silicon nitride film, effectively, in a one-step process in some embodiments. In other words, a film of TDMAT need not be applied, followed by deposition of silane.

In some embodiments, conventional metal-organic chemical vapor deposition (MOCVD), plasma enhanced chemical vapor deposition (PECVD), laser assisted chemical vapor deposition, or atomic layer deposition (ALD) may be utilized. The ratio of those precursors can range from 5 to 95 atomic percent TDMAT and from 5 to 95 atomic percent TrDMASi. In one embodiment, the ratio of TDMAT to TrDMASi is about one to ten.

In one embodiment, the layer 22 may be approximately 50 Angstroms thick. Over the layer 22 is a layer of nitride 23 that, in one embodiment, may be about 200 Angstroms thick. Finally, over the layer 23 may be a layer 24 of deposited oxide which, in one embodiment, may be about 900 Angstroms thick.

Figure 5:
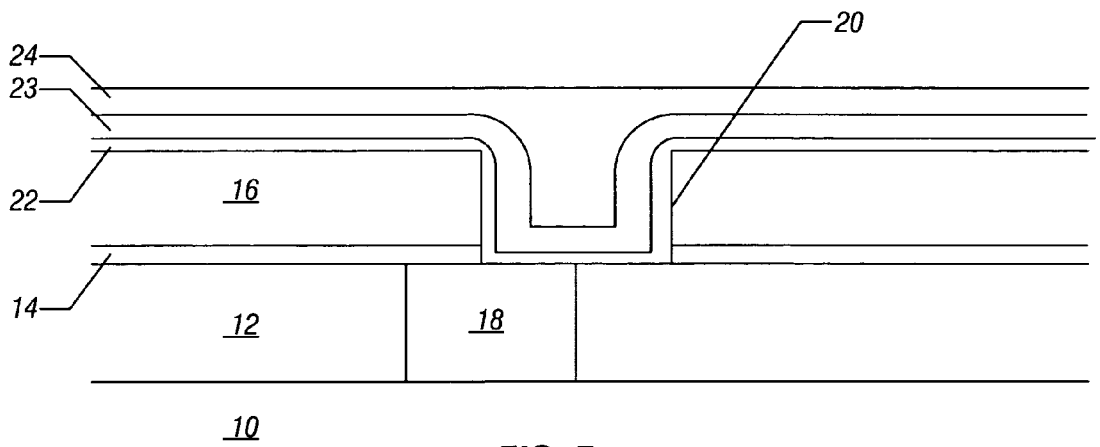
FIG. 5 is an enlarged, cross-sectional view of the embodiment shown in FIG. 4 at a subsequent stage of manufacture in accordance with one embodiment of the present invention.

As shown in FIGS. 4 and 5, the trench 20 may be situated with its center over the right edge of the conductor 18 in one embodiment of the present invention.

Figure 6:
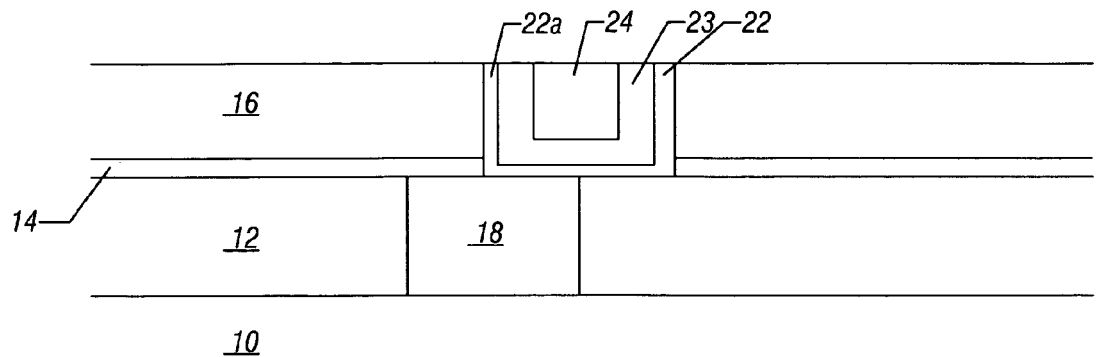
FIG. 6 is an enlarged, cross-sectional view of the embodiment shown in FIG. 5 at a subsequent stage of manufacture in accordance with one embodiment of the present invention.

Referring to FIG. 6, the structure shown in FIG. 5 may be planarized. As a result, the layer 22 that will act as a heater to change the phase of an overlying phase change material is U-shaped. Its offset positioning will enable the left upstanding arm of the layer 22 to act as a wall heater 22a, aligned under an overlying phase change material. The thickness of the wall heater 22a may be adjusted by adjusting the thickness of the deposited layer 22. Then, the wall heater 22a acts as a thin heating plate arranged on edge.

Figure 7:
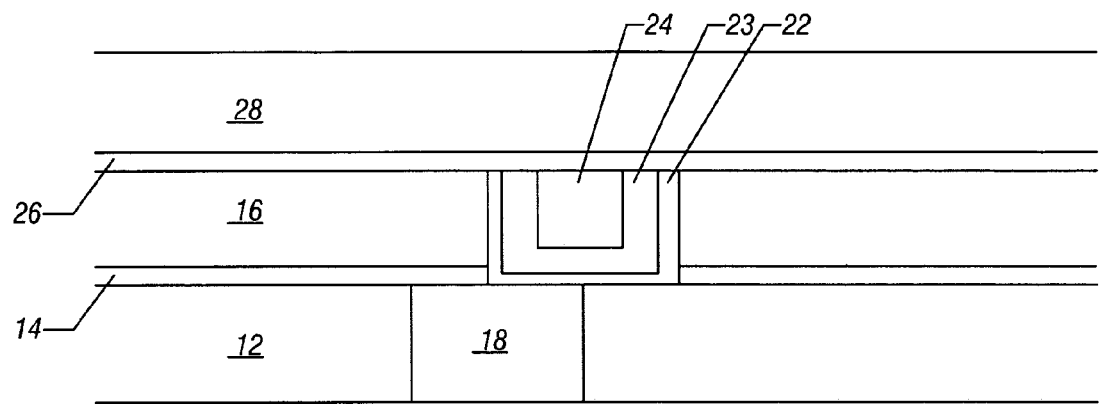
FIG. 7 is an enlarged, cross-sectional view of the embodiment shown in FIG. 6 at a subsequent stage of manufacture in accordance with one embodiment of the present invention.
Figure 8:
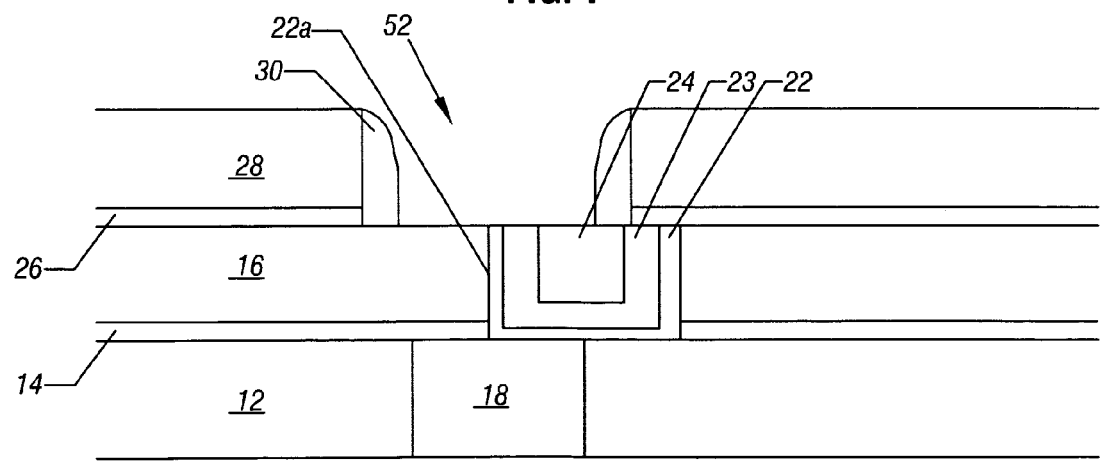
FIG. 8 is an enlarged, cross-sectional view of the embodiment shown in FIG. 7 at a subsequent stage of manufacture in accordance with one embodiment of the present invention.

Then, another nitride layer 16 and oxide layer 28 may be formed as indicated in FIG. 7. Next, a trench 52 is formed through the layers 26 and 28 and sidewall spacers 30 are formed thereon. A sidewall spacer 30 may be formed of nitride in one embodiment of the present invention. As indicated, the trench 52, lined with the spacer 30, may be aligned with the conductor 18, in one embodiment of the present invention, but because the trench 52 is wider than the conductor 18, the trench 52 extends laterally to either side of the conductor 18 as depicted in FIG. 8.

Figure 9:
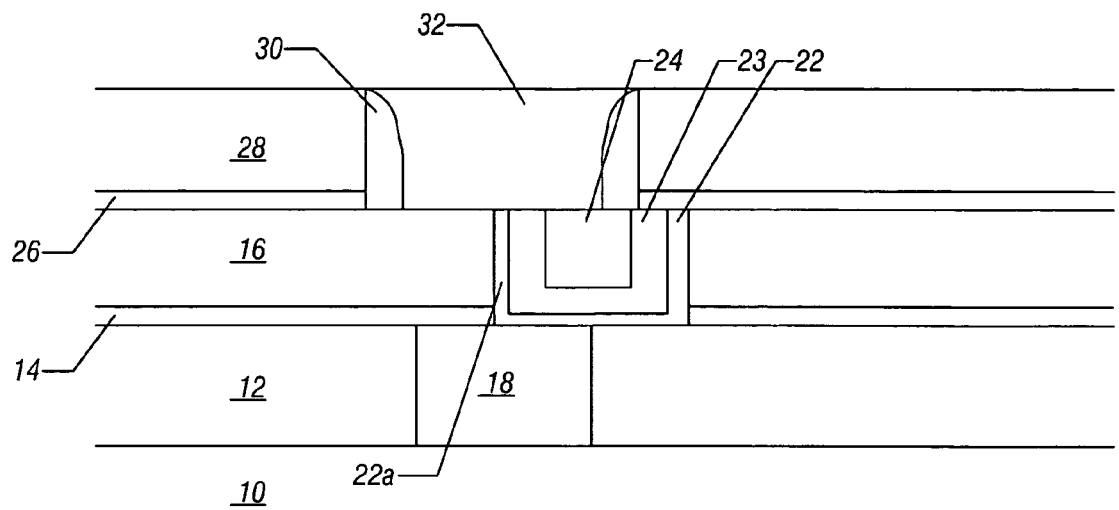
FIG. 9 is an enlarged, cross-sectional view of the embodiment shown in FIG. 8 at a subsequent stage of manufacture in accordance with one embodiment of the present invention.

Then, as shown in FIG. 9, the trench 52 may be filled with a phase change memory material 32 that is subsequently planarized to achieved the structure shown in FIG. 9. At this point the heater 22a is aligned centrally below the material 32. The material 32 forms a damascene memory element 130, defined within a trench in dielectric layers.

Figure 10:
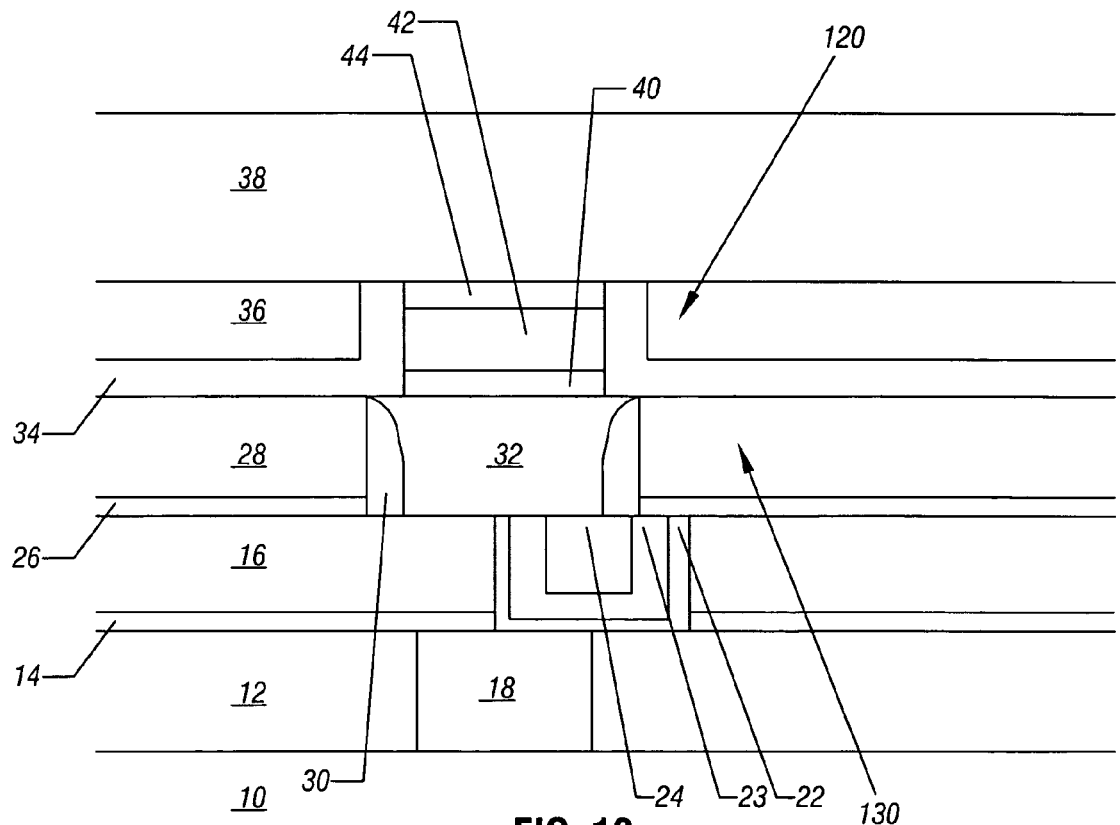
FIG. 10 is an enlarged, cross-sectional view taken generally along the line 10—10 in FIG. 10 of the embodiment shown in FIG. 9 at a subsequent stage of manufacture in accordance with one embodiment of the present invention.

Thereafter, as shown in FIG. 10, a select device or ovonic threshold device 120 (FIG. 1) is formed over the memory material 32, that forms the memory element 120 (FIG. 1). The select device 120 may include an L-shaped nitride layer 34, an oxide layer 36, and a conductor 38 that may be a column line 141–143 (FIG. 1). A memory material 42 is formed between upper electrode 44 and lower electrode 40. The nitride layer 34 may be formed by depositing the layer 34 over the stack of the memory material 42 and electrodes 44 and 40 and then filling with the oxide layer 36 to follow by planarizing the entire structure. This sequence is followed by the formation of the upper conductor 38.

Figure 11:
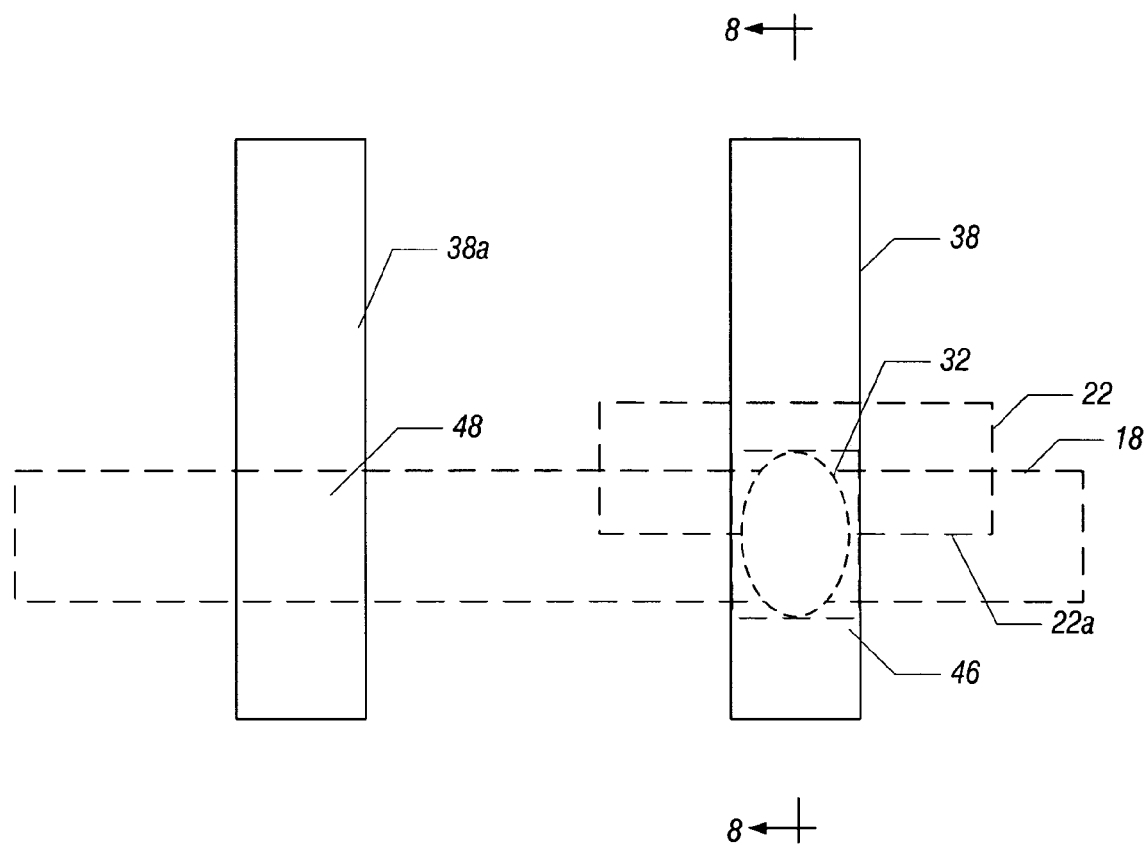
FIG. 11 is an enlarged, top plan view which is reduced relative to FIG. 10 in accordance with one embodiment of the present invention.

Thus, referring to FIG. 11, the conductor 18 may be transverse to two column conductors 38 in this embodiment. A via (not shown) may connect the upper conductor 38a to the underlying lower conductor 18. On the right in FIG. 11, the wall heater layer 22 is adjacent the memory material 32. The heater 22a is aligned centrally under the material 32 and centrally over the conductor 18. Current flow between conductors 18 and 38 results in electrical resistance heat developed by the heater 22a which heats the material 32.

The material 32 has an oval shape as a result of forming the trench 52 in an oval shape in FIG. 8, also causing the spacer 30 to have a corresponding oval shape. Thus, the elongate shape of the phase change material 32 in the column or upper electrode direction provides alignment tolerances between that material 32 and the overlying threshold device 120, as well as the underlying wall heater 22a. Other elongate shapes, including rectangles and ellipses, may also be used.

Because the wall heater 22a is U-shaped, its area may be reduced to a value below two-dimensional lithographic capabilities and the bulk of the heater 22 can be annealed or treated post deposition in some embodiments of the present invention.

Switching material 32 may be a phase change, programmable material capable of being programmed into one of at least two memory states by applying a current to switching material 32 to alter the phase of switching material 32 between a substantially crystalline state and a substantially amorphous state, wherein a resistance of switching material 32 in the substantially amorphous state is greater than the resistance of switching material 32 in the substantially crystalline state.

Programming of switching material 32 to alter the state or phase of the material may be accomplished by applying voltage potentials to conductors 14 and 38, thereby generating a voltage potential across select device 120 and memory element 130. When the voltage potential is greater than the threshold voltage of select device 120 and memory element 130, then an electrical current may flow through memory material 32 in response to the applied voltage potential, and may result in heating of memory material 32.

This heating may alter the memory state or phase of memory material 32. Altering the phase or state of memory material 32 may alter the electrical characteristic of memory material 32, e.g., the resistance of the material may be altered by altering the phase of the memory material 32. Memory material 32 may also be referred to as a programmable resistive material.

In the "reset" state, memory material 32 may be in an amorphous or semi-amorphous state and in the "set" state, memory material 32 may be in an a crystalline or semi-crystalline state. The resistance of memory material 32 in the amorphous or semi-amorphous state may be greater than the resistance of memory material 32 in the crystalline or semi-crystalline state. It is to be appreciated that the association of reset and set with amorphous and crystalline states, respectively, is a convention and that at least an opposite convention may be adopted.

Using electrical current, memory material 32 may be heated to a relatively higher temperature to amorphosize memory material 32 and "reset" memory material 32 (e.g., program memory material 32 to a logic "0" value). Heating the volume of memory material 32 to a relatively lower crystallization temperature may crystallize memory material 32 and "set" memory material 32 (e.g., program memory material 32 to a logic "1" value). Various resistances of memory material 32 may be achieved to store information by varying the amount of current flow and duration through the volume of memory material 32.

Although the scope of the present invention is not limited in this respect, the heater 22a may be titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 32.

Although the scope of the present invention is not limited in this respect, in one example, the composition of switching material 42 may comprise a Si concentration of about 14%, a Te concentration of about 39%, an As concentration of about 37%, a Ge concentration of about 9%, and an In concentration of about 1%. In another example, the composition of switching material 24 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 42 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 42 may include Si, Te, As, Ge, sulfur (S), and selenium (Se). As an example, the composition of switching material 42 may comprise a Si concentration of about 5%, a Te concentration of about 34%, an As concentration of about 28%, a Ge concentration of about 11%, a S concentration of about 21%, and a Se concentration of about 1%.

Conductive material 42, 44 may be a thin film material having a thickness ranging from about 20 Å to about 2000 Å. In one embodiment, the thickness of the material 28 may range from about 100 Å to about 1000 Å. In another embodiment, the thickness of the conductive material 42, 44 may be about 300 Å. Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 42.

Figure 12:
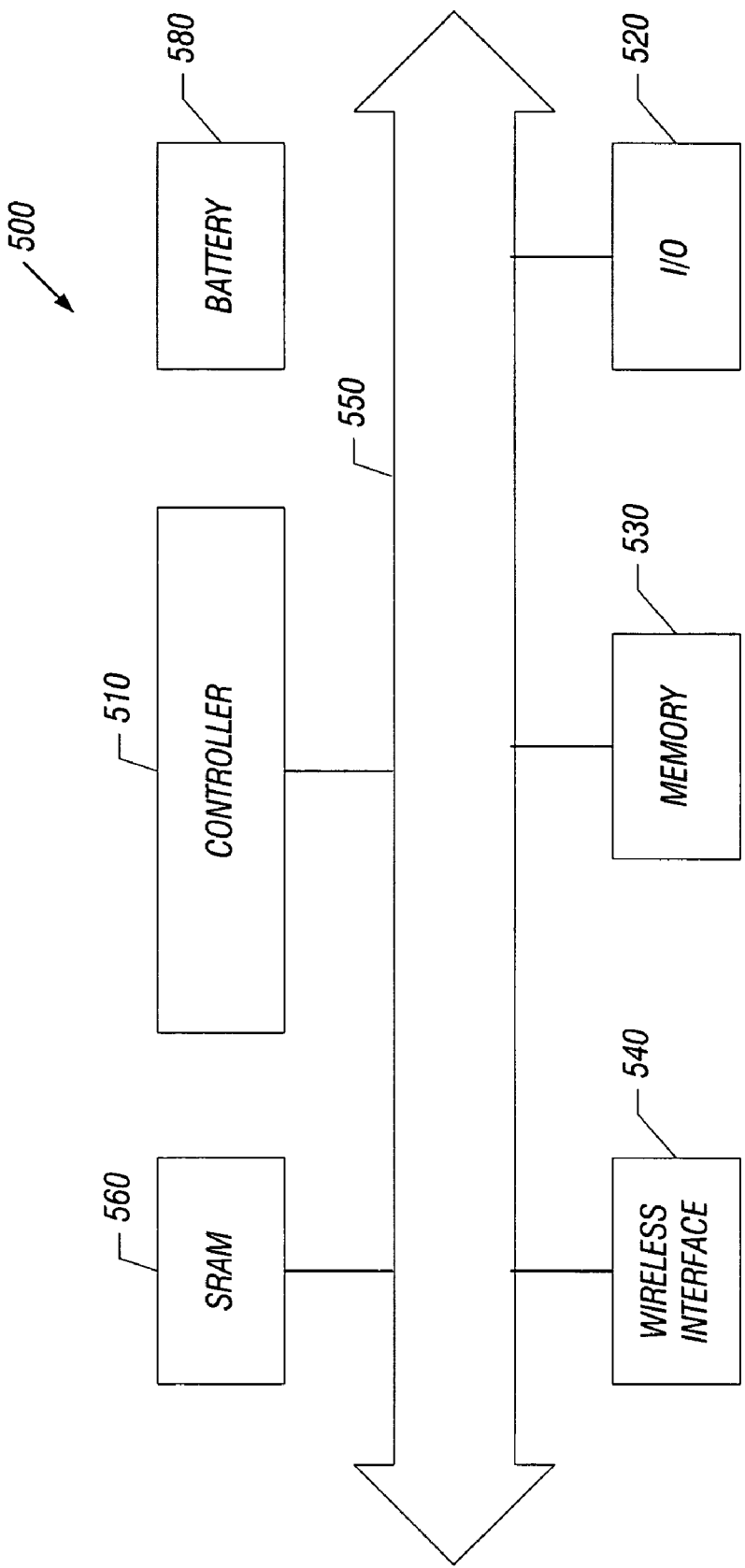
FIG. 12 is a schematic depiction of a system in accordance with one embodiment of the present invention.

Turning to FIG. 12, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a wall heater;
   a damascene phase change memory element on said wall heater; and
   a pair of transverse conductors and an elongated phase change material between said pair of conductors, said material being elongated in the direction of one of said conductors.

2. The apparatus of claim 1 wherein said wall heater is U-shaped including an upstanding arm in contact with said elongated phase change material.

3. The apparatus of claim 1 including a threshold device over said elongated phase change material.

4. The apparatus of claim 3 wherein said threshold device includes a chalcogenide material.

5. The apparatus of claim 3 including a threshold device including a chalcogenide material that does not change phase.

6. The apparatus of claim 3 including a threshold device formed within a dielectric layer over said elongated phase change material.

7. The apparatus of claim 1 including a dielectric layer with an opening, said elongated phase change material formed in said opening.

8. The apparatus of claim 7 including a second dielectric layer having an opening, said heater formed in said opening in said second dielectric layer, said second dielectric layer being below said first dielectric layer.

9. The apparatus of claim 1 wherein elongated phase change material is oval in shape.

10. A system comprising:
    a controller;
    a wireless interface coupled to said controller; and
    a phase change memory coupled to said controller including a wall heater and a damascene phase change memory element on said wall heater, said memory including a pair of transverse conductors and an elongated phase change material between said pair of conductors, said material being elongated in the direction of one of said conductors.

11. The system of claim 10 wherein said wall heater is U-shaped including an upstanding arm in contact with said elongated phase change material.

12. The system of claim 10 including a threshold device over said elongated phase change material.

13. The system of claim 12 wherein said threshold device includes a chalcogenide material.

14. The system of claim 12 including a threshold device including a chalcogenide material that does not change phase.

15. The system of claim 12 including a threshold device formed with a dielectric layer over said elongated phase change material.

16. The system of claim 10 including a dielectric layer with an opening, said elongated phase change material formed in said opening.

17. The system of claim 16 including a second dielectric layer having an opening, said heater formed in said opening in said second dielectric layer, said second dielectric layer being below said first dielectric layer.

18. The system of claim 10 wherein said elongated phase change material is oval in shape.

19. The system of claim 10 wherein said wireless interface includes a dipole antenna.

20. An apparatus comprising:
    a U-shaped heater including a pair of upstanding arms extending away from a base;
    a damascene phase change memory element coupled to one of said arms; and
    a pair of transverse conductors and an elongated phase change material between said pair of conductors, said material being elongated in the direction of one of said conductors.

21. The apparatus of claim 20 including a threshold device over said elongated phase change material.

22. The apparatus of claim 21 wherein said threshold device includes a chalcogenide material.

23. The apparatus of claim 21 wherein said threshold device includes a chalcogenide material that does not change phase.

24. The apparatus of claim 21 wherein said threshold device is formed within a dielectric layer over said elongated phase change material.

25. The apparatus of claim 20 including a dielectric layer with an opening, said elongated phase change material formed in said opening.

26. The apparatus of claim 25 including a second dielectric layer having an opening, said heater formed in said opening in said second dielectric layer, said second dielectric layer being below said first dielectric layer.

27. The apparatus of claim 20 wherein elongated phase change material is oval in shape.

* * * * *